(12) United States Patent
Koch et al.

(10) Patent No.: US 6,568,860 B2
(45) Date of Patent: May 27, 2003

(54) ELECTRONIC DEVICE WITH DATA BUS AND ENERGY BUS CONNECTION

(75) Inventors: Jörg Koch, Göppingen (DE); Rudi Singer, Wäschenbeuren (DE); Gerd Lausberg, Dortmund (DE); Marc Stanesby, Mettmann (DE); Udo Kienapfel, Düsseldorf (DE)

(73) Assignee: ERNI Elektroapparate GmbH, Adelberg (DE)

( * ) Notice: Subject to any disclaimer, the term of this patent is extended or adjusted under 35 U.S.C. 154(b) by 6 days.

(21) Appl. No.: 09/932,582

(22) Filed: Aug. 17, 2001

(65) Prior Publication Data

US 2002/0086577 A1 Jul. 4, 2002

(51) Int. Cl.⁷ .................................................. G02B 6/36
(52) U.S. Cl. .............................. 385/53; 385/54; 385/56; 385/76; 385/77
(58) Field of Search ............................. 385/53, 54, 56, 385/134, 135, 147, 25, 136, 137, 76, 77; 439/709, 719, 527, 533; 361/825, 826, 685, 684

(56) References Cited

U.S. PATENT DOCUMENTS

| | | | | |
|---|---|---|---|---|
| 5,039,194 A | * | 8/1991 | Block et al. | 385/88 |
| 5,430,823 A | * | 7/1995 | Dupont et al. | 385/135 |
| 5,666,456 A | * | 9/1997 | Merriken | 385/134 |
| 6,024,610 A | * | 2/2000 | Schaffer | 439/719 |
| 6,250,816 B1 | * | 6/2001 | Johnston et al. | 385/53 |
| 6,256,195 B1 | * | 7/2001 | Liao | 361/685 |
| 6,360,050 B1 | * | 3/2002 | Moua et al. | 385/135 |

\* cited by examiner

*Primary Examiner*—Mohammad Sikder
(74) *Attorney, Agent, or Firm*—Collard & Roe, P.C.

(57) ABSTRACT

An electronic device that can be pushed onto a support rail (15), having a housing (1), with an electronic module that can be inserted detachably into the housing, and bus contacts are provided for the transmission of data and/or energy to neighboring electronic devices that are pushed onto the support rail (15) and have an identical design, with appropriately designed bus terminal. The bus contacts can be displaced relative to the housing (1). The bus contacts can be immobilized via a latching fixture so that when in a latched position they can be brought into contact of the bus terminals in the neighboring device.

14 Claims, 9 Drawing Sheets

ELECTRONIC DEVICE WITH DATA BUS AND ENERGY BUS CONNECTION

BACKGROUND OF THE INVENTION

CROSS REFERENCE TO RELATED APPLICATIONS

Applicants claim priority under 35 U.S.C. §119 of German Application No. 100 40 651.3 filed Aug. 19, 2000.

1. Field of the Invention

This invention relates to an electronic device that can be pushed onto a support rail, with a housing, with an electronic module that can also be inserted detachably in the housing, and with bus contacts for transmission of data and/or energy to neighboring electronic devices pushed onto the support rail and having identical design, with appropriately designed bus terminals.

The connection of neighboring electronic devices which are pushed or plugged onto a common top-hat rail or support rail via so-called bus connections is known and widely used. The bus connections have electrical and/or optical transmission elements or terminals, which project laterally from the housing of the electronic device, and which can be brought into contact with transmission elements or terminals having complementary shape on the adjacent device. If a plurality of devices is plugged onto a support rail, the bus connections form a common, continuous conductor rail for supplying energy to the devices, as well as a data bus for transmission of data and/or control signals. Normally the direct-current-carrying conductor rail has two poles and the data bus is provided with, for example, eight independent lines. As is known to those skilled in the art, these bus connections have the form among others of blade-and-spring contacts that can be inserted one inside the other, or are designed with optoelectronic fixtures. For this purpose, the bus contacts project beyond the housing wall on one side and, when the neighboring housing is pushed together on the support rail, the contacts are brought into engagement with correspondingly shaped bus terminals. Usable electronic devices include among others, switching, closed-loop control or open-loop control devices, input/output modules, logic components for signal acquisition and processing or other electronic components that can be grouped together on a support rail and brought into electrical contact with one another via the common bus connections. The devices usually have standardized dimensions.

2. The Prior Art

If one of the electrical devices has to be exchanged, for example because it is defective or because it will be replaced by a device with different functions, it has been necessary heretofore to pull all neighboring devices off from the support rail, in order to gain access to the device in question. Certainly there are known snap-on/latching connections with which the housing of the device can be mounted and fixed on the support rail directly from above, but detachment of the device when it is plugged together with neighboring devices is no longer possible, since the contacts of the bus connections project laterally beyond the device, and are engaged in the neighboring device. In order nevertheless to exchange defective devices or to replace them by other devices, it is known that the housing can be constructed in two parts, in order to be able to remove an upper part and to gain access, in the housing interior, to a printed-circuit board or other electronic unit that can be fixed detachably to the lower part of the device. Here, the lower part is pushed onto the support rail and connected with neighboring lower parts via the bus contacts.

It is regarded as a disadvantage in this case, however, that the lower part still remains on the support rail, and so the exchange procedure described in the foregoing must nevertheless be undertaken in the event of a defect in the lower part. Moreover, it is never possible to rule out the risk of damaging the bus contacts projecting laterally beyond the housing, especially during transportation and storage, and great care is needed when pushing the devices onto the support rail, in order not to bend or damage them and thus prevent establishment of contact with neighboring devices.

SUMMARY OF THE INVENTION

An object of the invention is to design an electronic device that can be pushed onto a support rail so that the terminals and contacts for the bus connections are protected from damage in the unassembled condition of the device, and the device can be exchanged for another without the need to remove neighboring devices from the support rail.

This object is achieved according to the invention by the fact that the bus contacts can be displaced relative to the housing, and the bus contacts can be immobilized via a latching fixture so that, in a latched position, they can be brought into contact in the bus terminals in the neighboring device.

The invention allows the bus contacts to be displaced relative to the housing. The term "bus contacts" is to be understood as all arrangements for establishing optical and/or electrical contact of neighboring devices with one another, and the establishment of contact with the neighboring device is of detachable design. The arrangements can be of any desired type, in particular as electrical contact strips or as optical waveguides, as described hereinafter. The arrangements that establish contact can also be designed as USB contacts, as are known for computers. To immobilize the contacts relative to the housing there is provided a latching fixture, that can be immobilized at least in one position so that they extend laterally beyond the wall of the housing. In the assembled condition on the support rail they are engaged in the terminals of the neighboring device. It is immaterial within the scope of the invention whether each bus contact can be displaced and latched individually or whether, for example, the contacts of the data bus can be displaced together. The nature of the contacts and terminals can be either electrical or optical, or in other words with optical waveguides. The latching fixture can be constructed as desired, or as described hereinafter. In order to ensure establishment of contact of the individual devices with one another, the connection of neighboring housings is made either via further connecting fixtures or, as explained hereinafter, with the same latching fixture. By means of the bus contacts, a continuous or discontinuous bus connection is obtained when a plurality of devices is grouped together. The bus connection to the energy supply of the individual devices is generally designed to be continuous, in order to supply all devices commonly with current. Depending on requirement, the bus connection for data transmission between neighboring devices can also be designed to be discontinuous or, if data transmission between neighboring devices is not desired, to be separated.

The advantage of the invention is that, because of the displaceability of the bus contacts relative to the housing, they can be completely retracted into the housing, and damage thereto is avoided for practical purposes, especially during the assembly of a plurality of devices or during transportation. To establish electrical and/or optical contact, they are pushed laterally out of the housing, and automatically connected to corresponding terminals in the neighboring housing. In order to prevent inadvertent detachment of the connection, there is used the latching fixture, which immobilizes it in contact position. Moreover, it is ensured that the electronic device together with completely retracted bus contacts can be lifted upward from the support rail, on which it had been fixed by a further latching connection, for example. For this purpose, it is only necessary to retract the terminals of the neighboring device. Nevertheless, it is no longer necessary to remove the device itself from the support rail.

Preferably the bus contacts are displaced parallel to the support rail in order to establish contact with the neighboring device to prevent any bending of the terminals during insertion of a contact strip into a spring contact on the neighboring device. One possible embodiment of the bus contacts are the blade-and-spring contacts, which can be inserted one into the other, and which are known to those skilled in the art. For this purpose, contact strips in the form of flat metal blades are pushed relative to the housing, and brought into engagement with correspondingly shaped spring contacts on or in the neighboring housing. The spring contacts are aligned so that their clamping effect is exerted perpendicular to the direction in which the contact strips are inserted in them.

A further type of bus contact comprises transmitters and receivers for light rays. Here the components used are known in optoelectronics, for infrared radiation or for radiation of a particular frequency, or of arbitrary frequencies, depending on requirements, such as data transmission rate. In this case, the bus contacts that can be displaced relative to the housing and latched are optical waveguides for light of the desired frequency. The transmitter and receiver are connected with the electronic device inserted into the housing, while another fixture is also interposed here in order to convert the electrical input and output signals of the device into radiation pulses or radiation modulation.

In one advantageous improvement of the invention, neighboring housings are detachably fixed to one another with the latching fixture for the contact strips. In this way it is ensured that not only they themselves are immobilized relative to the housing, but at the same time, the neighboring devices are also mechanically connected to one another. For this purpose, the latching fixture can be designed as described hereinafter. The advantage is that additional fixtures for fixing the devices to one another are superfluous, and the assembly of a plurality of devices on one support rail is accelerated.

Advantageously, the contact strips or the optical waveguides for data transmission and energy transmission respectively can be displaced independently of one another. For this purpose, they are combined respectively in a sliding element, which can be displaced relative to the housing and immobilized detachably via a latching connection. As an example, the contact strips for an eight-pole, electrical data bus are disposed in parallel and spaced apart from one another on the sliding element, so that they can be displaced together and engage simultaneously in the spring contacts of the neighboring device. Preferably the sliding element is guided in a tunnel-like passage in the housing, whose longitudinal axis is oriented parallel to the support rail, the passage having a lateral aperture so that the sliding element can be manually actuated from outside. The passage can be provided with additional slot-like recesses, in which the contact strips projecting partly beyond the sliding element are guided, the longitudinal axes of the recesses also being oriented parallel to the support rail. The sliding element then extends through the lateral aperture of the passage, and projects at least partly beyond the wall of the housing, so that it can be manipulated by the user.

To latch the sliding element relative to the housing, one or more projections can be molded onto the housing outside and/or onto the inside, in the interior of the passage. Also one or more projections which have complementary shape and which can be engaged with the first-mentioned projections can be present on the sliding element. Preferably three projections are attached on the narrow front end of the housing. One each directly on the side faces and the third substantially at the center of the front end. If the sliding element, whose length corresponds to the width of the housing, is equipped with two projections at each of its ends, it can be displaced between two end positions, into each of which it is latched. In this way, the mechanical connection is resistant to pulling in displacement direction and is established between neighboring device housings, and simultaneously, contact is established between the bus contacts attached to the sliding element and terminals on or in the neighboring device. The projections on the inside of the device or of the passage can be disposed in the same way.

In order to facilitate displacement of the sliding element relative to the housing in latched position, the projections on the housing and/or sliding element are provided with chamfered faces, the chamfers being inclined away from the sliding direction, and, during displacement, bearing slidingly against the opposite projection. To unlock the sliding element, the latched projection can be raised slightly from the housing wall using the tip of a screwdriver, and pushed back over the projection on the housing.

To obtain symmetric mechanical fastening of neighboring devices to one another, the sliding elements for the data bus and for the current bus are disposed on opposite sides of the housing or of the support rail. This offers the further advantage that the voltage present at the two poles of the energy supply does not influence the measurement or control signals transmitted on the data-bus lines during establishment of electrical contact and vice versa.

In order also to connect the neighboring electronic devices to one another on the regions of the housings facing away from the support rail, additional sliding elements, whose latching fixtures are correspondingly designed, can additionally be provided there. They are not necessarily equipped with contact strips or optical waveguides.

To manufacture housings and/or sliding elements, they can be made of plastic, and in particular can be manufactured in an injection-molding process. Appropriate plastics and the production of appropriate injection-molding molds for the components as well as the manufacture thereof are known to those skilled in the art. In the use of optical waveguides for establishment of contact, the entire sliding element can be manufactured as an injection-molded part from a transparent plastic that is suitable as an optical waveguide. Alternatively a base member can be produced, on which the optical waveguides, which are made of a different plastic or of a suitable optical material, are plugged and, for example, can also be exchanged.

In order to prevent ingress of contaminants into the interior of the housing, the passage in which the sliding element is guided is provided with detachably fixable caps, which cover the apertures substantially completely. They are provided in turn with a plurality of small slots, through which the bus contacts pass in the extended condition of the sliding element. Preferably the cap fits flush on the housing wall, and is fixed detachably to the housing via a further latching connection.

If a series of electronic devices are grouped together on a support rail and connected to one another via the bus contacts, those bus contacts at a device in end position project beyond the housing wall. To protect these contacts from contamination or damage, there is provided a protective hood, which can also be detachably fixed to the housing via a latching fixture, and which encloses the contacts substantially on all sides. The protective hood and the aforesaid cap can also be manufactured from plastic.

Since bending of individual contact strips or other damage to the sliding element can never be completely avoided, especially if individual devices are frequently removed and installed, the sliding elements are completely detachable from the housing, so that they can be exchanged for undamaged elements. For this purpose, a projection on the sliding element is raised over the lateral projection on the housing, and it is withdrawn completely from the tunnel-like passage. The opposite sequence is followed to insert a new, undamaged sliding element. If a cap is present which simultaneously functions to ensure that the sliding element cannot be lost, it must be removed first of all in order to extract it from the passage.

BRIEF DESCRIPTION OF THE DRAWINGS

Other objects and features of the present invention will become apparent from the following detailed description considered in connection with the accompanying drawings. It should be understood, however, that the drawings are designed for the purpose of illustration only and not as a definition of the limits of the invention.

In the drawing, wherein similar reference characters denote similar elements throughout the several views.

DETAILED DESCRIPTION OF PREFERRED EMBODIMENTS

Figure 1:
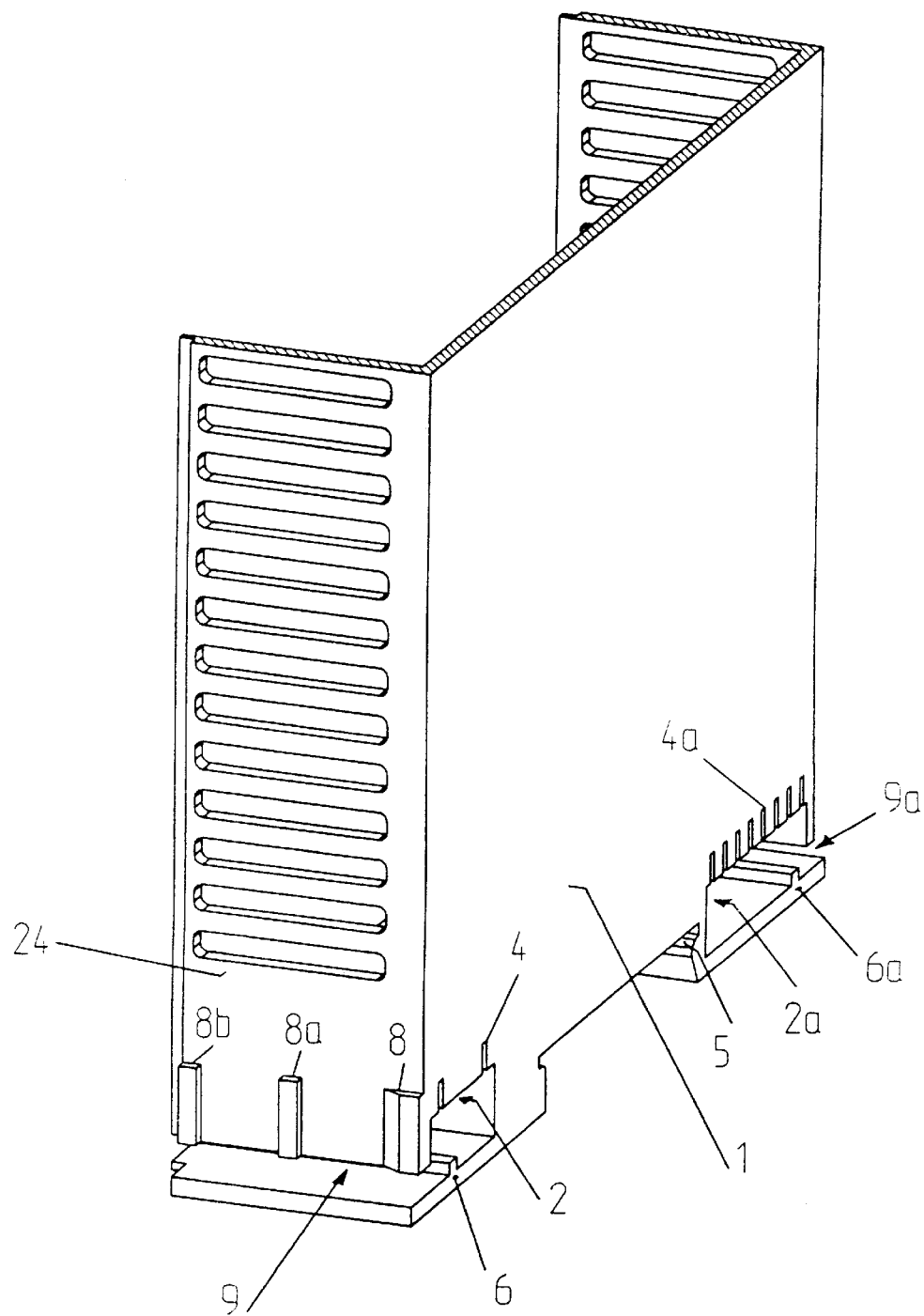
FIG. 1 shows a housing with two passages for sliding elements.

Referring to FIG. 1, there is shown a housing 1, which is intended for electronic devices and which can be pushed onto a support rail 15 or can be fixed detachably to support rail 15 (FIG. 5) with a snap-on or latching mechanism which is known in itself. Housing 1 is provided on each of opposite sides of support rail 15 with passages 2, 2a, in which a sliding element 3 (FIG. 2) is guided. Passages 2, 2a are provided with slot-like recesses 4, 4a, in which the contact strips 10 (FIG. 2) for establishing electrical contact are guided. In addition, upwardly projecting guides 6, 6a, which are oriented parallel to the longitudinal axis of support rail 15 and which engage in a corresponding recess 7 of sliding element 3 (FIG. 2), are molded onto the underside of passages 2, 2a. Projections 8, 8a, 8b, which are used for latching sliding element 3, are molded onto the outside of housing 1 wherein one projection 8 is provided with a face chamfered in displacement direction, in order to facilitate sliding of sliding element 3 over projection 8. Projections 8 can also be disposed in the interior of passage 2. At the side faces of housing 1 there are provided apertures 9, 9a, through which an inserted sliding element 3 extends at least partly, in order to manipulate it from outside. Seat 5 for support rail 15 is disposed on the underside of housing 1.

Figure 2:
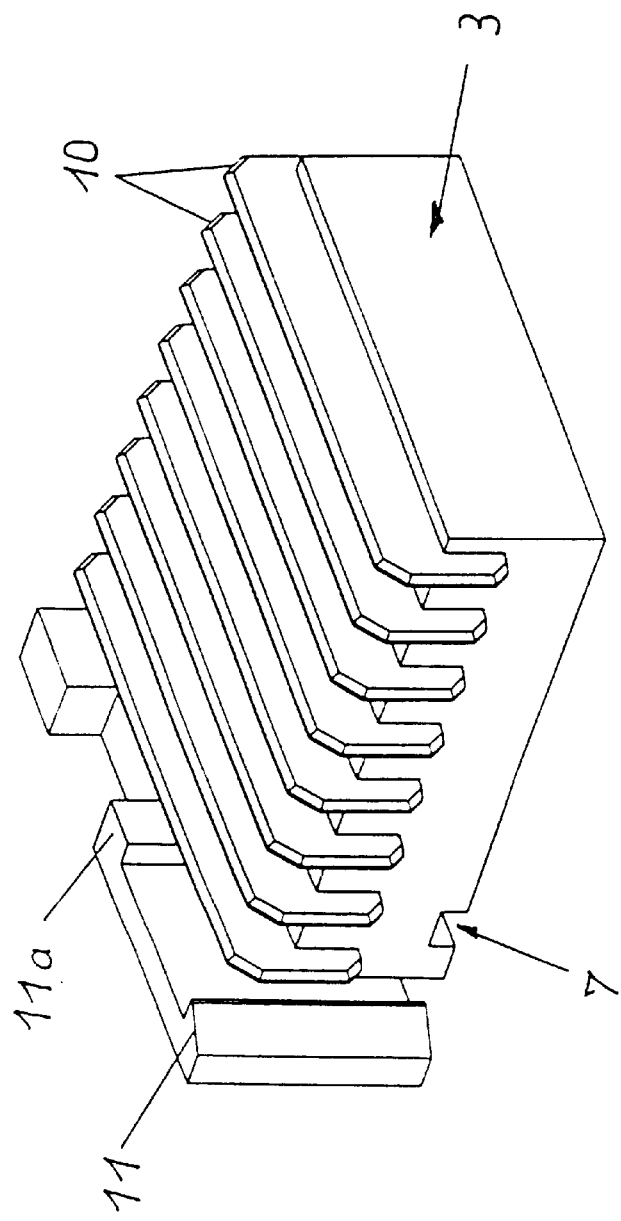
FIG. 2 shows a sliding element with eight contact strips for a data bus.

FIG. 2 illustrates sliding element 3 of the data bus with eight metal contact strips 10 which, for example, are pressed into a sliding element 3 made of plastic. Recess 7 on the underside is used for guidance in tunnel-like passage 2. On its outside, it is provided with projections 11, 11a, which can also be equipped with a chamfered face, in order to latch it on or behind corresponding projections 8, 8a, 8b on the side face of housing 1. Displacement of element 3 relative to housing 1 takes place in the longitudinal direction of contact strips 10.

Figure 3:
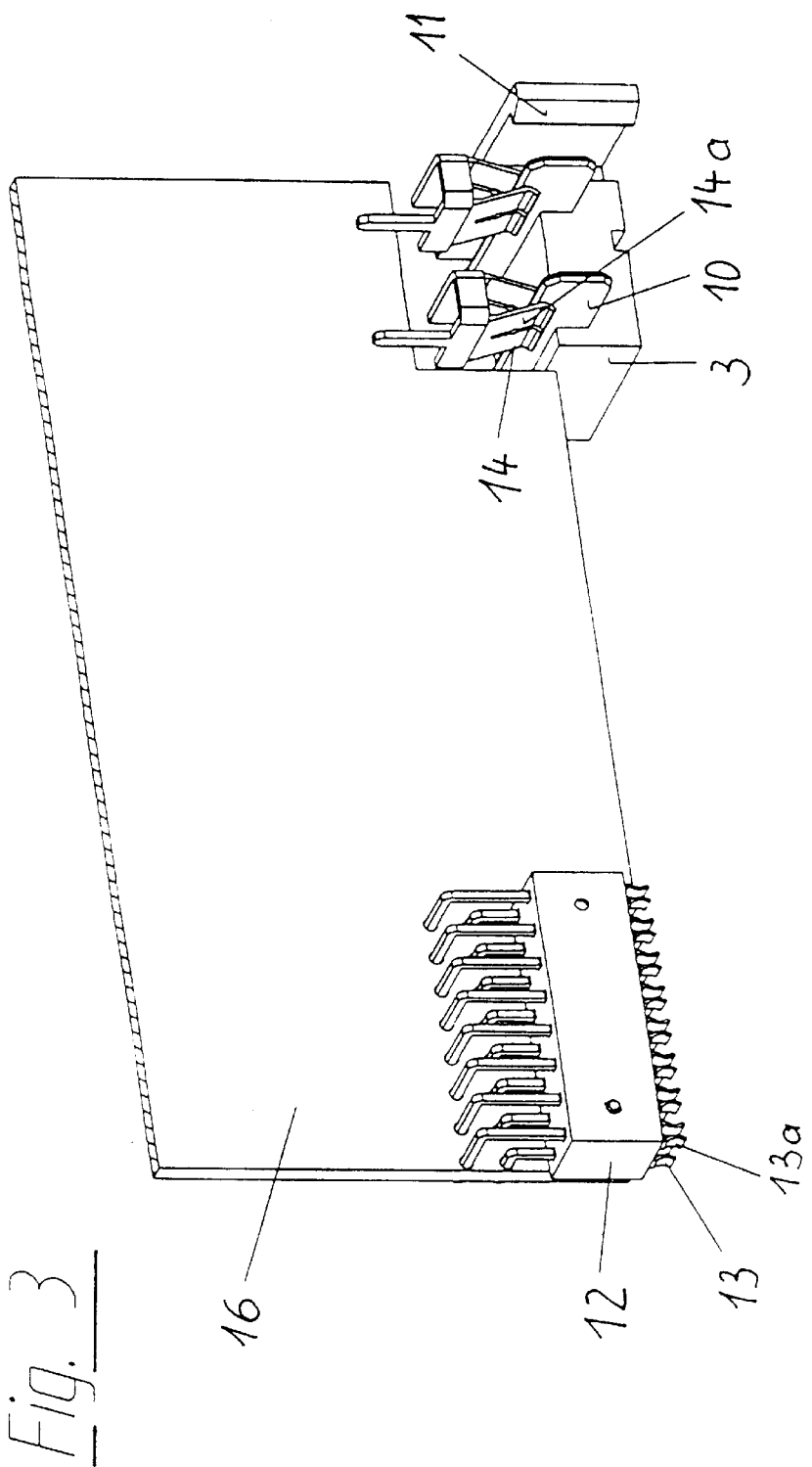
FIG. 3 shows a plug-in card which is inserted into the housing, with a sliding element in middle position.

FIG. 3 schematically illustrates a plug-in card 16 that can be inserted in housing 1. Each data bus 12 is provided with eight electrical terminals 13, 13a, which can be brought into contact with two neighboring sliding elements 3. A further sliding element 3 with two contact strips 10 for energy supply is illustrated here in so-called middle position. This means that strips 10, whose length corresponds substantially to the width of housing 1, do not project laterally beyond housing 1, which can be pushed off upward from support rail 15 without removing the neighboring devices beforehand.

Figure 4:
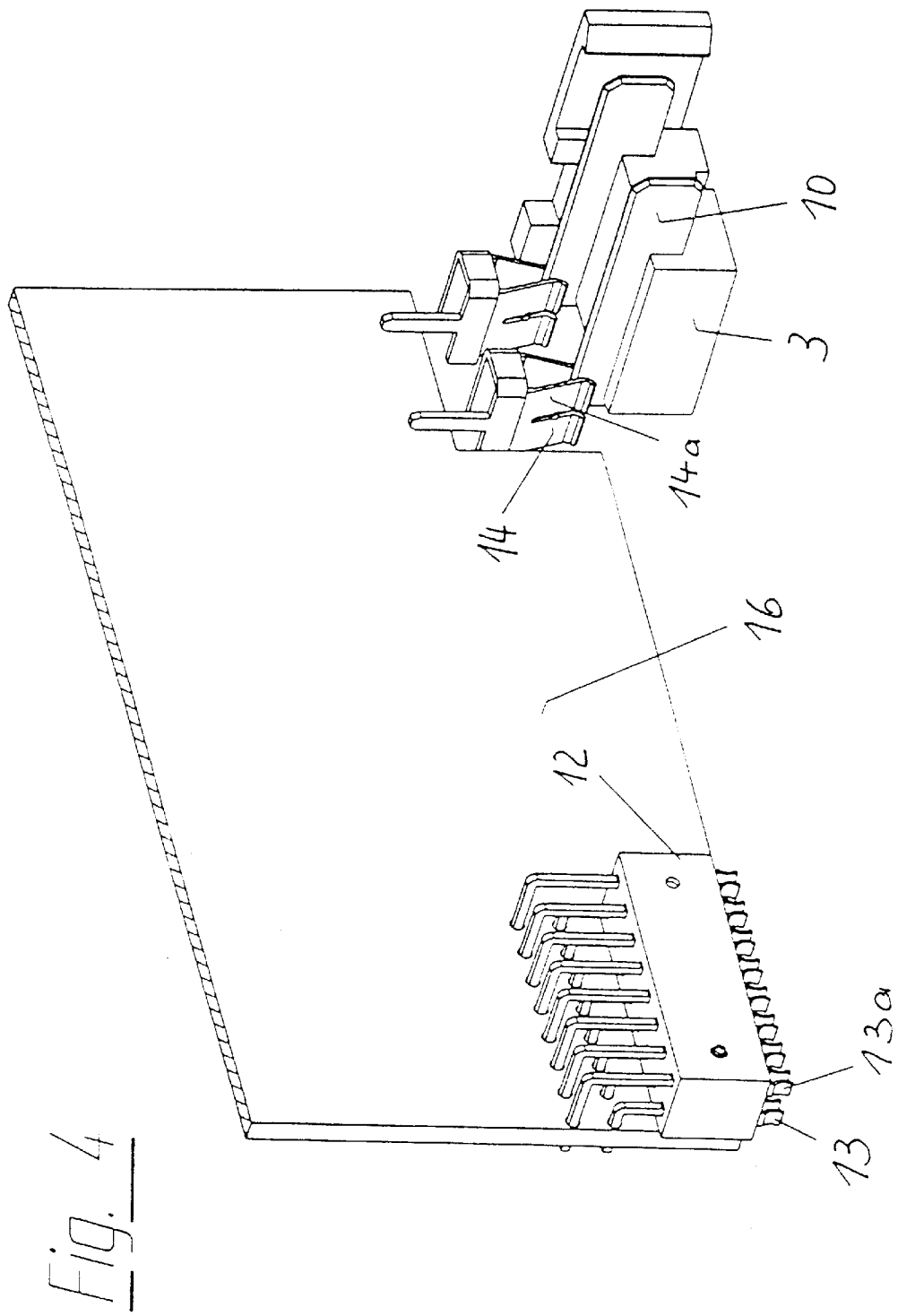
FIG. 4 shows a plug-in card with a sliding element in latched position.

To establish electrical contact, sliding element 3 is displaced relative to housing 1, or in other words it projects together with electrically conductive contact strips 10 out of one side of housing 1, as is evident in FIG. 4. When the latching fixture is appropriately positioned, contact strips 10 are in contact with only part of spring contacts 14 or only with the spring contacts of one terminal side 13 of data bus 12. Contact strips 10 of the next neighboring device engage in the other spring contacts 13a or in the other part of spring contacts 14a for the current supply.

Figure 5:
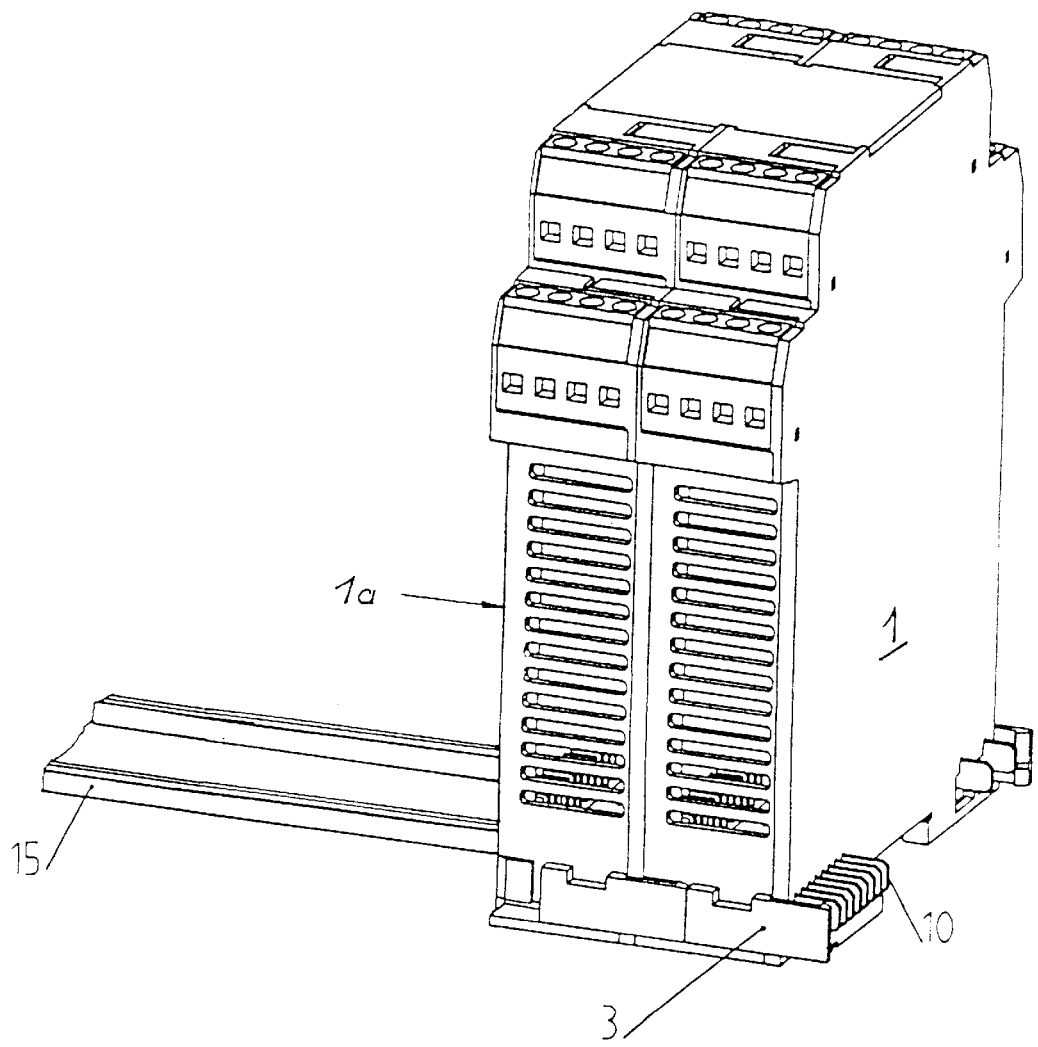
FIG. 5 shows a plurality of electronic devices disposed one next to the other.

Several electrical devices disposed one next to the other are represented in the diagram in FIG. 5, in which neighboring devices are brought into electrical contact with one another and simultaneously, are detachably fixed to one another via sliding elements 3. Sliding elements 3 disposed on the right device project with their contact strips 10 laterally beyond the device but, when neighboring sliding element 3 is retracted in turn, can be brought into the middle position illustrated in FIG. 3. An additional, latchable protective hood can also be provided for protection of the projecting contact strips 10. In order to be able to lift off the middle device, for example, it is merely necessary to bring its sliding element 3 into middle position, to detach any fixation to support rail 15, and to lift it off. There is no longer any need to remove the neighboring devices beforehand, but instead it is merely necessary to retract their sliding elements 3.

Figure 6:
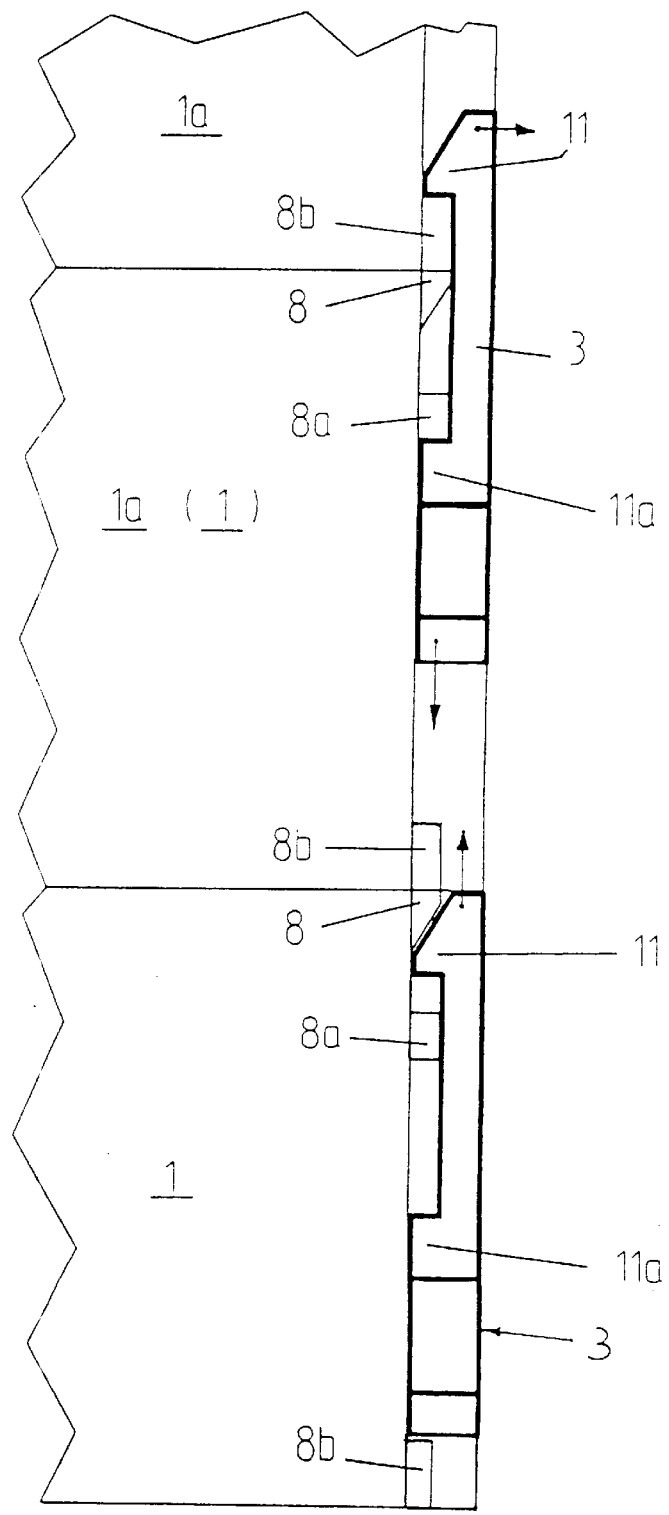
FIG. 6 shows a latching fixture in schematic representation.

FIG. 6 illustrates the part of sliding elements 3 equipped with projections 11, 11a, as well as the outside housing wall of neighboring housings 1, 1a equipped with projections 8, 8a, 8b. The chamfered face of a projection 11 on a sliding element 3 can therefore slide over the likewise chamfered face of a projection 8 on the same housing wall, and projection 11 can latch into place behind a further projection 8b on neighboring housing 1a. Thereby sliding element 3 is latched with the bus contacts in such a way that not only are the neighboring devices brought into contact, but also housings 1, 1a are connected detachably to one another. If necessary, the respective location of fixation of projections 8, 8a, 8b on side wall 24 of housing 1 or 1a can also be different. In addition, in order to suit the purpose, the geometric shape selected for projections 8, 8a, 8b can be different from that illustrated here in FIG. 6. Projections 11 and 11a on sliding element 3 are then designed and/or disposed so that they correspond to these differently shaped projections 8, 8a, 8b.

Figure 7:
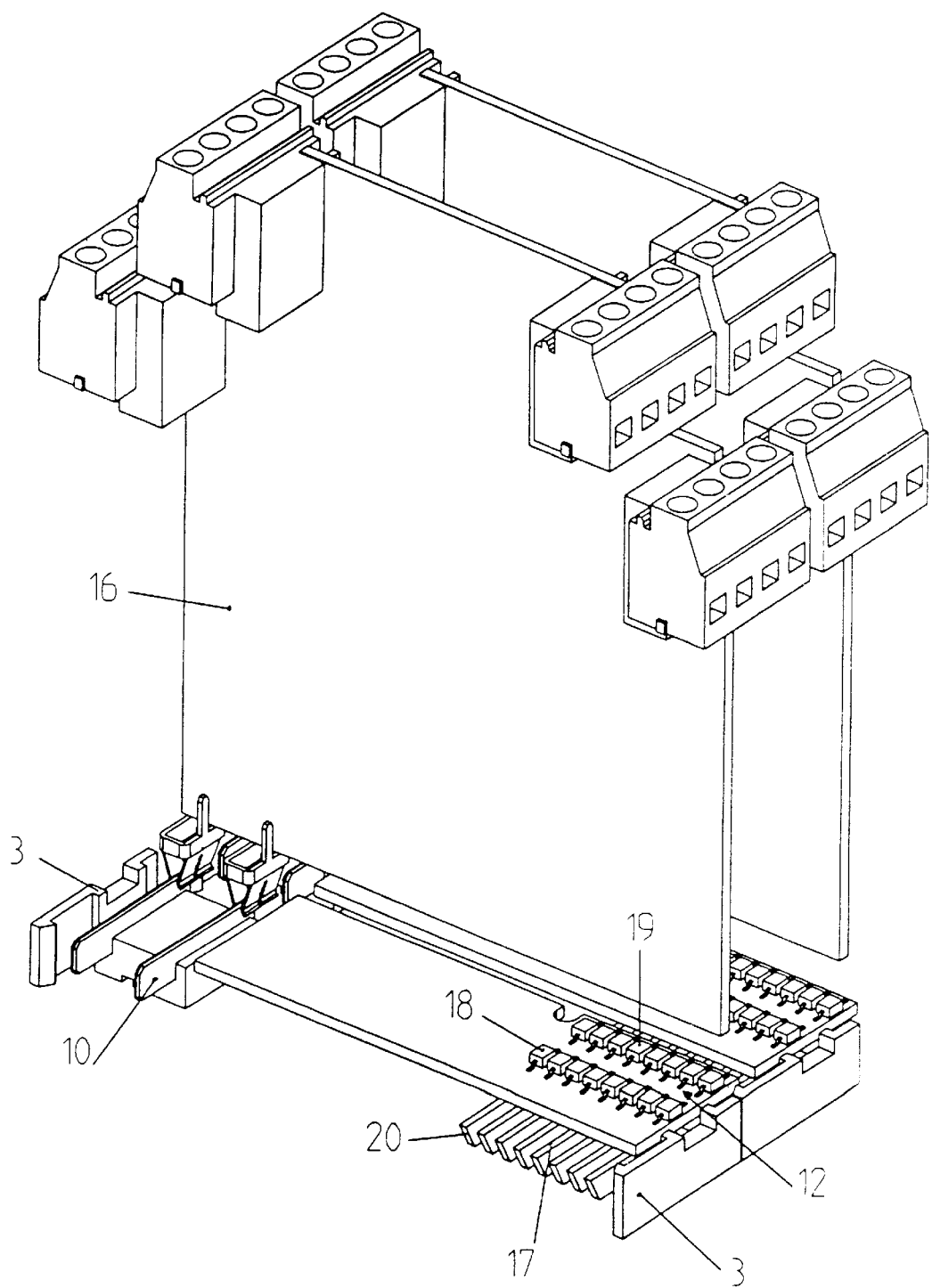
FIG. 7 shows a plug-in card with optical and electrical contacts.

FIG. 7 represents a plug-in card 16, which is inserted into housing 1. It is provided with electrical terminals for the current supply with contact strips 10. Eight-pole data bus 12 is constructed with optical waveguides 17. Coupling of light into and out of waveguide 17 takes place at transmitters 18, and receivers 19 which are suitable for the purpose and whose arrangement corresponds to that of spring contacts 14 described above. In this case, optical waveguides 17, which preferably are made of plastic, are trapezoidal strips, on chamfered edge 20 wherein the incoming light is totally reflected by virtue of the difference in refractive index relative to the surrounding air, and is guided further in the longitudinal direction of waveguide 17. At the opposite inclined edge 20, it is deflected upward once again to receiver 19. The arrangement of optical waveguides 17 corresponds to that of contact strips 10 on sliding element 3.

Figure 8:
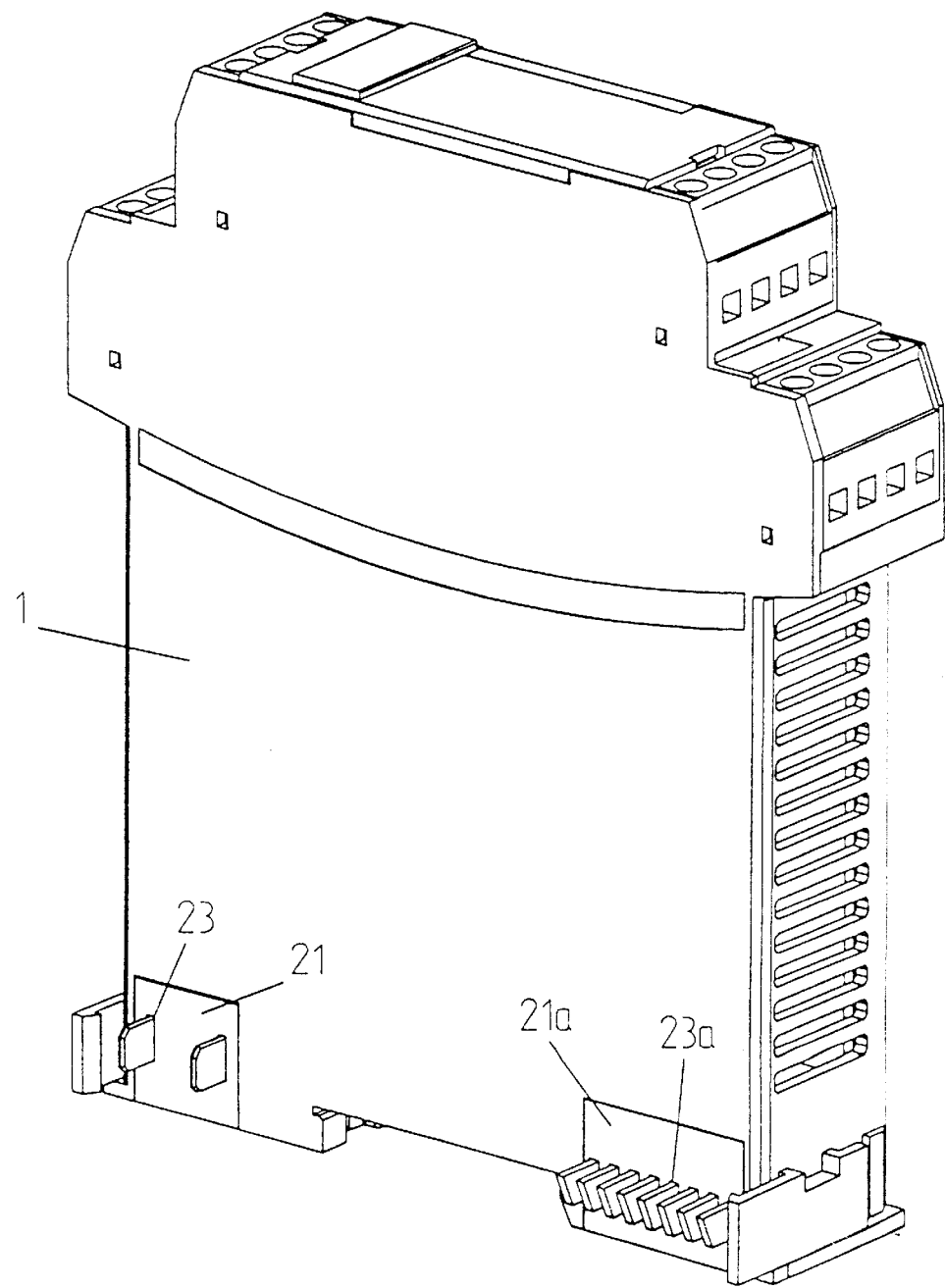
FIG. 8 shows a housing with caps.

FIG. 8 shows a housing 1 whose passages 2, 2a are closed with caps 21, 21a, which in turn are provided with a plurality of slot-like apertures 23, 23a, through which contact strips 10 or optical waveguides 17 pass. Cap 21 remains over passage 2 both in the extended and retracted condition of sliding element 3, and it can be used simultaneously as a safeguard against the loss of sliding element 3.

Figure 9:
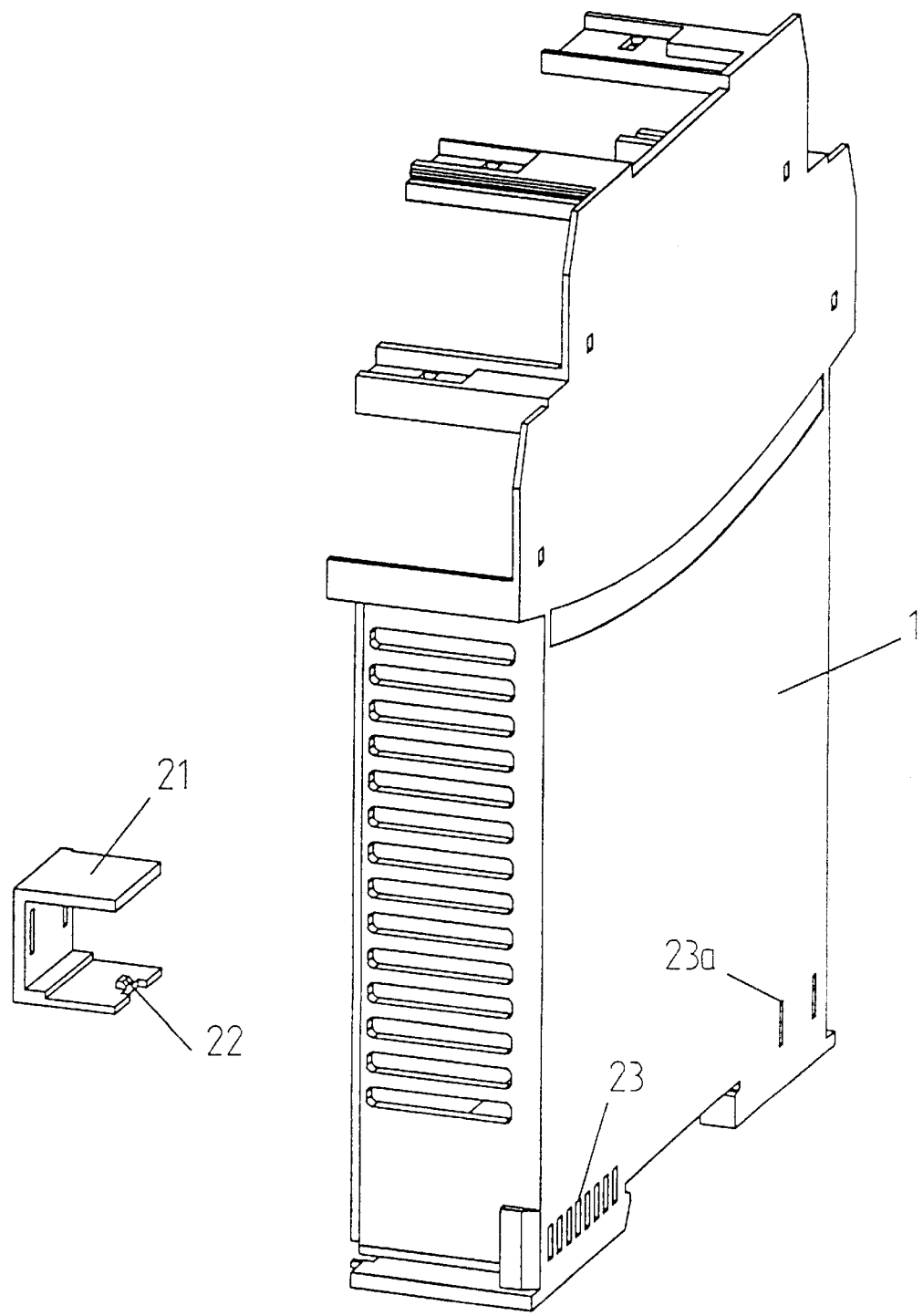
FIG. 9 shows an empty housing.

In FIG. 9, cap 21 is provided with a latching nose 22, which is directly molded on and which can be brought into engagement in a corresponding latching hole in housing 1, and thus can be fixed detachably, as represented in FIG. 9. In this case housing 1 is designed so that passage 2, 2a is closed almost completely by the housing wall, so that only slots 23, 23a designed to correspond to the contacts permit these contacts to extend through into the housing interior or out of the housing interior in order to make a continuous bus connection.

While several embodiments of the present invention have been shown and described, it is to be understood that many changes and modifications may be made thereunto without departing from the spirit and scope of the invention as defined in the appended claims.

What is claimed is:

1. An electronic device for detachable mounting on a support rail (15), comprising;
    at least one housing (1), having an electronic module detachably inserted into the housing, said housing including a latching fixture, said module having module data and power terminals; and
    bus contacts for contact with said module data and power terminals and for the transmission of data and/or energy to neighboring electronic devices that are pushed onto the support rail (15) and have an identical design, wherein said bus contacts are displaceable relative to the housing (1) between a first position wherein said bus contacts are retracted within said housing, and a latched position wherein said bus contacts protrude from said housing for contact with the module data and power terminals in the neighboring device, said bus terminals being secured to said housing via said latching fixture when in said latched position.

2. The electronic device according to claim 1, wherein said bus contacts are displaceable parallel to the support rail (15).

3. The electronic device according to claim 1 wherein said module terminals comprise spring contacts (13, 14) and said bus contacts comprise contact strips (10) corresponding thereto, the contact strips (10) being displaceable relative to said housing (1) to the latched position.

4. The electronic device according to claim 2 wherein said module terminal 9 comprise transmitters (18) and receivers (19) for light rays, and,
    said bus contacts comprise corresponding optical waveguides (17), wherein said optical waveguides (17) are displaceable relative to said housing (1) to the latched position.

5. The electronic device according to claim 4 wherein said housing comprises adjacent housings (1) fixed detachably to one another with the latching fixture.

6. The electronic device according to claim 5 wherein said contact strips (10) and/or said optical waveguides (17) for data transmission and energy transmission are combined respectively in a sliding element (3) displaceable to the latched position, wherein said sliding element (3) is guided in a tunnel-like passage (2), which is laterally open in at least portions, in said housing (1).

7. The electronic device according to claim 6 wherein said latching fixture comprises projections (8) molded onto said housing outside and/or the inside and the sliding element (3) comprises correspondingly shaped projections (11) said projections (8) being disposed so that, in the latched position, said sliding element (3) engages behind a respective projection (8) on the neighboring housing (1) and simultaneously connects them mechanically to one another in a manner that resists pulling.

8. The electronic device according to claim 7 comprising chamfered faces disposed on said sliding element (3) and/or on said projection (8) to ensure easier displacement, and wherein the faces are inclined away from the displacement direction.

9. The electronic device according to claim 8 wherein said sliding elements (3) with said contact strips (10) and/or said optical waveguides (17) for data and energy transmission are disposed on opposite sides of the support rail (15).

10. The electronic device according to claim 9 comprising further latchable sliding elements (3) provided on said housing (1).

11. The electronic device according to claim 1 wherein said housing (1) and said sliding elements (3) are made of plastic, and are manufactured in an injection-molding process.

12. The electronic device according to claim 10 comprising a cap 21 detachably fixed for closing the aperture of said passage (2), and wherein said cap (21) adjoins the housing wall in flush manner and/or is fixed via a further latching connection.

13. The electronic device according to claim 10 comprising a protective hood detachably fixed to enclose the bus contacts substantially on all sides when they are in an extended condition, and wherein it is fixed via a further latching connection.

14. The electronic device according to claim 10 wherein said sliding element (3) is removable from said housing (1).

* * * * *

UNITED STATES PATENT AND TRADEMARK OFFICE
CERTIFICATE OF CORRECTION

PATENT NO. : 6,568,860 B2
DATED : May 27, 2003
INVENTOR(S) : Koch et al.

It is certified that error appears in the above-identified patent and that said Letters Patent is hereby corrected as shown below:

<u>Title page,</u>
Item [30], Foreign Application Priority Data, should read:

-- [30]        Foreign Application Priority Data
August 19, 2000     (DE) ..............................100 40 651.3 --

Signed and Sealed this

Twentieth Day of January, 2004

JON W. DUDAS
*Acting Director of the United States Patent and Trademark Office*